(12) United States Patent
Osaka

(10) Patent No.: US 11,521,875 B2
(45) Date of Patent: Dec. 6, 2022

(54) CARRIER SPACER AND METHOD OF MANUFACTURING SEMICONDUCTOR DEVICE

(71) Applicant: Mitsubishi Electric Corporation, Tokyo (JP)

(72) Inventor: Masashi Osaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 83 days.

(21) Appl. No.: 17/013,160

(22) Filed: Sep. 4, 2020

(65) Prior Publication Data

US 2021/0166961 A1 Jun. 3, 2021

(30) Foreign Application Priority Data

Dec. 3, 2019 (JP) .............................. JP2019-218603

(51) Int. Cl.
*H01L 21/67* (2006.01)
*H01L 21/673* (2006.01)
*B65G 49/07* (2006.01)

(52) U.S. Cl.
CPC ........ *H01L 21/67303* (2013.01); *B65G 49/07* (2013.01); *H01L 21/67196* (2013.01)

(58) Field of Classification Search
None
See application file for complete search history.

(56) References Cited

U.S. PATENT DOCUMENTS

| 10,832,927 B2* | 11/2020 | Escusa | .............. H01L 21/67369 |
| 2005/0011808 A1* | 1/2005 | Pylant | .............. H01L 21/67369 |
| | | | 206/710 |
| 2012/0205282 A1* | 8/2012 | Pylant | .............. H01L 21/67389 |
| | | | 206/592 |

FOREIGN PATENT DOCUMENTS

JP 2009-040431 A 2/2009

* cited by examiner

*Primary Examiner* — Ronald P Jarrett
(74) *Attorney, Agent, or Firm* — Studebaker & Brackett PC

(57) ABSTRACT

A carrier spacer includes an annular main body, a first tapered part formed on an inner peripheral part of a front surface of the main body, a second tapered part formed on the inner peripheral part of a reverse surface of the main body, a flat surface formed on the outer peripheral side of the first tapered part on the front surface of the main body and holding the reverse surface of the outer peripheral part of a semiconductor wafer, a peripheral edge part formed on the outer peripheral side of the flat surface of the main body and provided with a step having a height position higher than a height position of the flat surface, an arcuate cutout part formed from the peripheral edge part to the flat surface of the main body, and a pair of handles protruding from the peripheral edge part toward the outer peripheral side.

8 Claims, 7 Drawing Sheets

F I G. 7
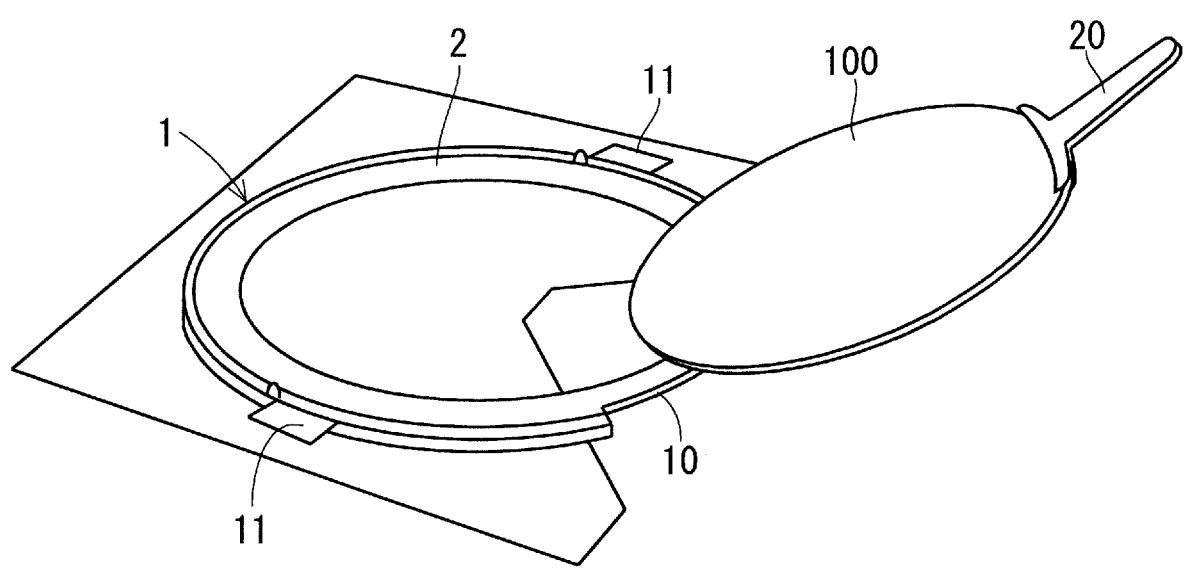

CARRIER SPACER AND METHOD OF MANUFACTURING SEMICONDUCTOR DEVICE

BACKGROUND OF THE INVENTION

Field of the Invention

The present invention relates to a carrier spacer and a method of manufacturing a semiconductor device using the carrier spacer.

Description of the Background Art

When a semiconductor wafer is transferred in a manufacturing step of a semiconductor device, a dedicated case for wafer transfer is used. The dedicated case allows a plurality of semiconductor wafers to be vertically stacked and transferred. However, when the plurality of semiconductor wafers is vertically stacked, the vertically adjacent semiconductor wafers may come into contact and be damaged. Therefore, a carrier spacer interposed between vertically adjacent semiconductor wafers is used (for example, see Japanese Patent Application Laid-Open No. 2009-40431).

However, in a technique disclosed in Japanese Patent Application Laid-Open No. 2009-40431, it is not assumed that the semiconductor wafers are individually transferred while being stored on the carrier spacers. Thus, when each of the semiconductor wafers is individually transferred, it has been necessary to grip an outer peripheral part of the semiconductor wafer with tweezers and suck a center of the semiconductor wafer with vacuum tweezers or the like for transportation. As a result, there has been a risk of scratches on the semiconductor wafer or adhesion of foreign matter depending on the number of times of contact with a front surface of the semiconductor wafer.

SUMMARY

It is an object of the present invention to provide a technique capable of reducing contact with a front surface of a semiconductor wafer, and suppressing damage to the semiconductor wafer and adhesion of foreign matter when the semiconductor wafer is individually transferred.

The carrier spacer according to the present invention is a carrier spacer that is interposed between vertically adjacent semiconductor wafers when a plurality of semiconductor wafers is vertically stacked. The carrier spacer includes an annular main body, a first tapered part, a second tapered part, a flat surface, a peripheral edge part, an arcuate cutout part, and a pair of handles. The first tapered part is formed on an inner peripheral part of the front surface of the main body, and is inclined such that an inner peripheral side is located below an outer peripheral side. The second tapered part is formed on the inner peripheral part of the reverse surface of the main body, and is inclined such that the inner peripheral side is located above the outer peripheral side. The flat surface is formed on the outer peripheral side of the first tapered part on the front surface of the main body and holds the reverse surface of the outer peripheral part of the semiconductor wafer. The peripheral edge part is formed on the outer peripheral side of the flat surface of the main body and has a step whose height position is higher than that of the flat surface. The cutout part is formed from the peripheral edge part of the main body to the flat surface. The pair of handles protrudes from the peripheral edge part toward the outer peripheral side.

An operator can transfer the semiconductor wafer together with the carrier spacer using the pair of handles when individually transferring the semiconductor wafer. This can reduce contact with the front surface of the semiconductor wafer and thus prevent scratches on the semiconductor wafer and adhesion of foreign matter to the semiconductor wafer.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a diagram for explaining a step of storing the semiconductor wafer on a front surface side of the carrier spacer;

DESCRIPTION OF THE PREFERRED EMBODIMENT

Preferred Embodiment

Figure 1:
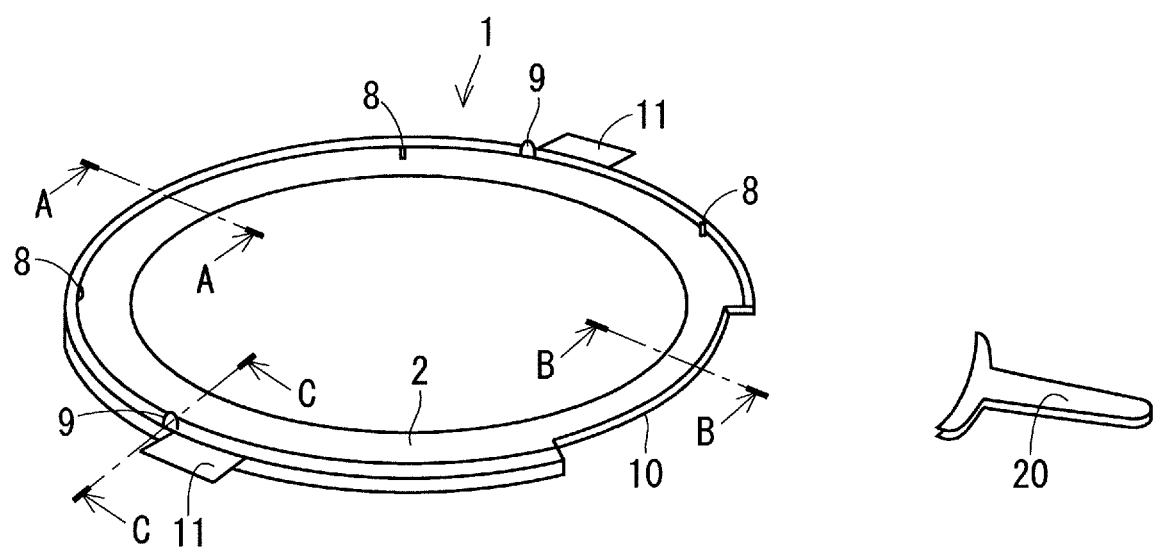
FIG. 1 is a perspective view of a carrier spacer according to a preferred embodiment.
Figure 2:
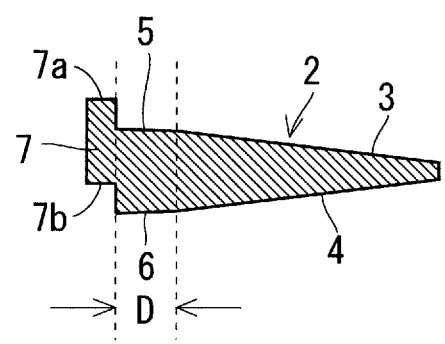
FIG. 2 is a sectional view taken along the line A-A of FIG. 1.
Figure 3:
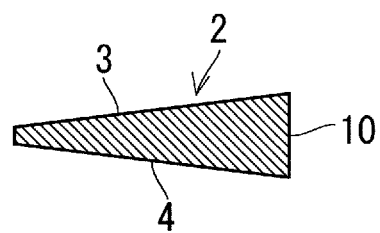
FIG. 3 is a sectional view taken along the line B-B of FIG. 1.
Figure 4:
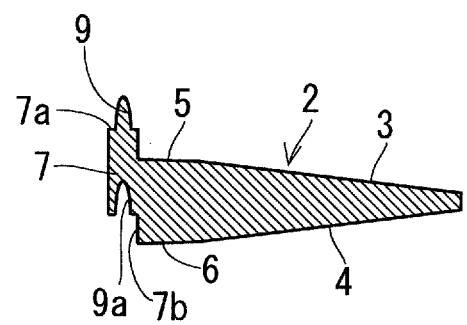
FIG. 4 is a sectional view taken along the line C-C of FIG. 1.
Figure 5:
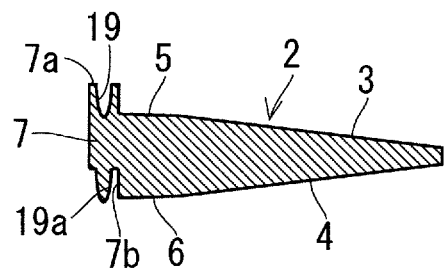
FIG. 5 is a view corresponding to FIG. 4 in a modified example of the preferred embodiment.
Figure 6:
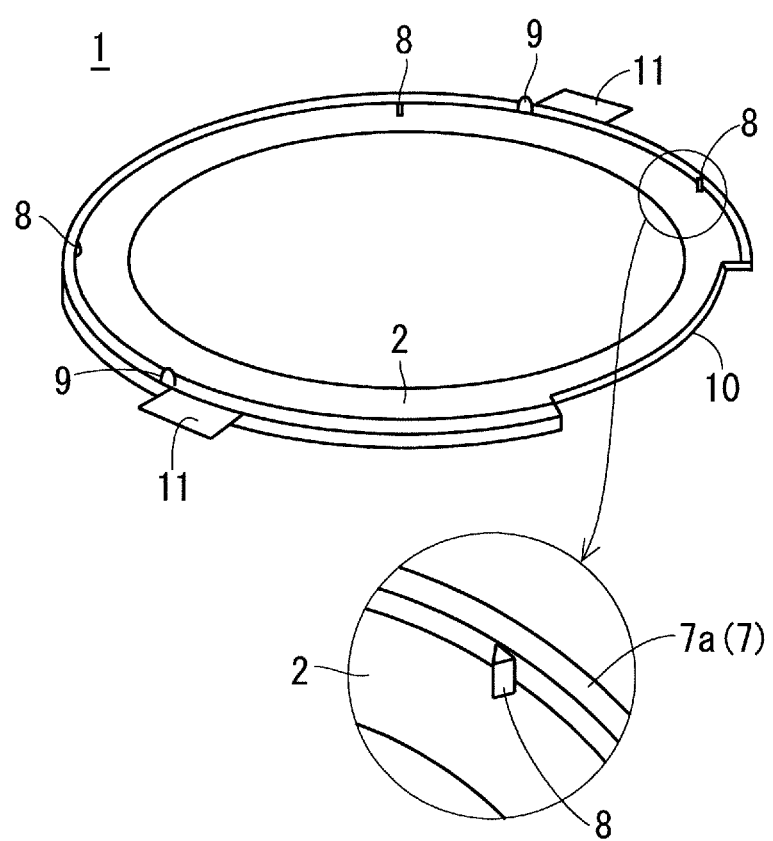
FIG. 6 is a perspective view of the carrier spacer and an enlarged perspective view of a projection included in the carrier spacer.

A preferred embodiment of the present invention will be described below with reference to the drawings. FIG. 1 is a perspective view of a carrier spacer 1 according to the preferred embodiment. FIG. 2 is a sectional view taken along the line A-A of FIG. 1. FIG. 3 is a sectional view taken along the line B-B of FIG. 1. FIG. 4 is a sectional view taken along the line C-C of FIG. 1. FIG. 5 is a view corresponding to FIG. 4 in a modified example of the preferred embodiment. FIG. 6 is a perspective view of the carrier spacer 1 and an enlarged perspective view of a projection 8 included in the carrier spacer 1.

The carrier spacer 1 is a member interposed between vertically adjacent semiconductor wafers 100 when a plurality of semiconductor wafers 100 (see FIG. 9) is vertically stacked, and each of the semiconductor wafers 100 is stored on top of the carrier spacer 1. Here, as the semiconductor wafer 100 to be stored on the carrier spacer 1, a semiconductor wafer for power devices is used.

As shown in FIG. 1, the carrier spacer 1 includes an annular main body 2 and a pair of handles 11. Parts of the carrier spacer 1, which are the main body 2 and the pair of handles 11, are formed of, for example, a resin material having conductivity in order to suppress damage to the semiconductor wafer 100 due to static electricity.

As shown in FIGS. 1 and 2, the main body 2 includes tapered parts 3, 4, flat surfaces 5, 6, a peripheral edge part 7, a plurality of (for example, three) projections 8, a plurality of (for example, two) alignment protrusions 9, and a cutout part 10.

The tapered part 3 is formed on an inner peripheral part of a front surface of the main body 2, and is an inclined surface whose inner peripheral side is located below an outer peripheral side. The tapered part 4 is formed on the inner peripheral part of a reverse surface of the main body 2, and is an inclined surface whose inner peripheral side is located above the outer peripheral side. Here, the tapered part 3 corresponds to a first tapered part, and the tapered part 4 corresponds to a second tapered part.

The flat surface 5 is formed on the outer peripheral side of the tapered part 3 on the front surface of the main body 2, and holds the reverse surface of the outer peripheral part of the semiconductor wafer 100. Further, the flat surface 6 is formed on the outer peripheral side of the tapered part 4 on the reverse surface of the main body 2. A width D of the flat surfaces 5, 6 is less than or equal to 5 mm. A lower limit of the width D is set in accordance with a diameter of the semiconductor wafer 100.

The semiconductor wafer 100 does not contact the tapered part 3 on the front surface of the main body 2, and thus a contact area between the carrier spacer 1 and the semiconductor wafer 100 can be reduced. Further, in a state where a plurality of the carrier spacers 1 is stacked, the semiconductor wafers 100 adjacent downward do not come into contact with the tapered part 4 on the reverse surface of the main body 2. This can prevent scratches or the like from occurring on the front surface of the semiconductor wafer 100.

The peripheral edge part 7 is formed on the outer peripheral side of the flat surfaces 5, 6 of the main body 2. On the front surface of the peripheral edge part 7, a step 7a having a height position higher than that of the flat surface 5 is formed. The step 7a is formed higher in height position than the front surface of the semiconductor wafer 100 and covers the outer peripheral side of the semiconductor wafer 100, and thus a protrusion of the semiconductor wafer 100 to the outer peripheral side can be suppressed.

Further, on the reverse surface of the peripheral edge part 7, a groove 7b into which a step 7a on the peripheral edge part 7 of the carrier spacers 1 adjacent downward can be fitted is formed in a state where the plurality of carrier spacers 1 is stacked. As a result, the vertically adjacent carrier spacers 1 can be stacked at a small interval, and thus a large number of semiconductor wafers 100 can be transferred in a smaller space.

As shown in FIG. 4, the two alignment protrusions 9 are formed on a front surface of the peripheral edge part 7, specifically, at a position on the peripheral edge part 7 where the projections 8 are not formed, at positions where the alignment protrusions 9 face each other with respect to a center of the main body 2. Visually observing the two alignment protrusions 9 by an operator can suppress mistakes in vertical and horizontal directions when the carrier spacers 1 are vertically stacked. Note that, on the reverse surface of the peripheral edge part 7, two recesses 9a into which the two alignment protrusions 9 of the downward adjacent carrier spacers 1 can be fitted respectively are formed in a state where the plurality of carrier spacers 1 is stacked.

Instead of the two alignment protrusions 9, two alignment recesses 19 may be formed as shown in FIG. 5. In this case, two protrusions 19a that can be fitted into the two alignment recesses 19 are formed on the reverse surface of the peripheral edge part 7.

As shown in FIG. 6, the three projections 8 projecting toward the inner peripheral side are formed on an inner side surface of the step 7a at predetermined intervals. The three projections 8 have a triangular shape with the inner peripheral side of the main body 2 as an apex in a plan view, and hold the semiconductor wafer 100 by making line contact with three predetermined positions at the outer peripheral end of the semiconductor wafer 100.

In the semiconductor wafer 100 for power devices, a metal electrode of about several μm needs to be formed on the semiconductor wafer 100. In some cases, during a transfer of the transferring case in which the plurality of carrier spacers is stacked and stored, a film deposited on the outer peripheral end of the semiconductor wafer 100 comes into contact with the carrier spacers or the transferring case, and the film is peeled off to generate dust and decrease a yield of the semiconductor wafer 100. In order to prevent such a case, the contact with the outer peripheral end of the semiconductor wafer 100 is set to be a line contact.

As shown in FIGS. 1, 3, and 6, the cutout part 10 is formed in an arc shape on the outer peripheral part of the main body 2. Specifically, the cutout part 10 is formed from a part of the peripheral edge part 7 of the main body 2 to a part of the flat surfaces 5, 6. Wafer tweezers 20 can be inserted from the cutout part 10 side to take out and store the semiconductor wafer 100 because an arcuate length of the cutout part 10 is formed longer than an arcuate length at a tip of the wafer tweezers 20. Further, it is possible to suppress buffer between the wafer tweezers 20 and the carrier spacer 1 because the cutout part 10 is in the same arcuate shape as the tip of the wafer tweezers 20.

Next, the pair of handles 11 will be described. As shown in FIGS. 1 and 6, the pair of handles 11 protrudes from an outer surface of the peripheral edge part 7 of the main body 2 toward the outer peripheral side. The pair of handles 11 is provided around the two alignment protrusions 9, that is, at positions facing each other with respect to the center of the main body 2. The operator can transfer the carrier spacer 1 by gripping the pair of handles 11, and thus individually transfer the semiconductor wafer 100 together with the carrier spacer 1 without directly touching the semiconductor wafer 100.

Figure 8:
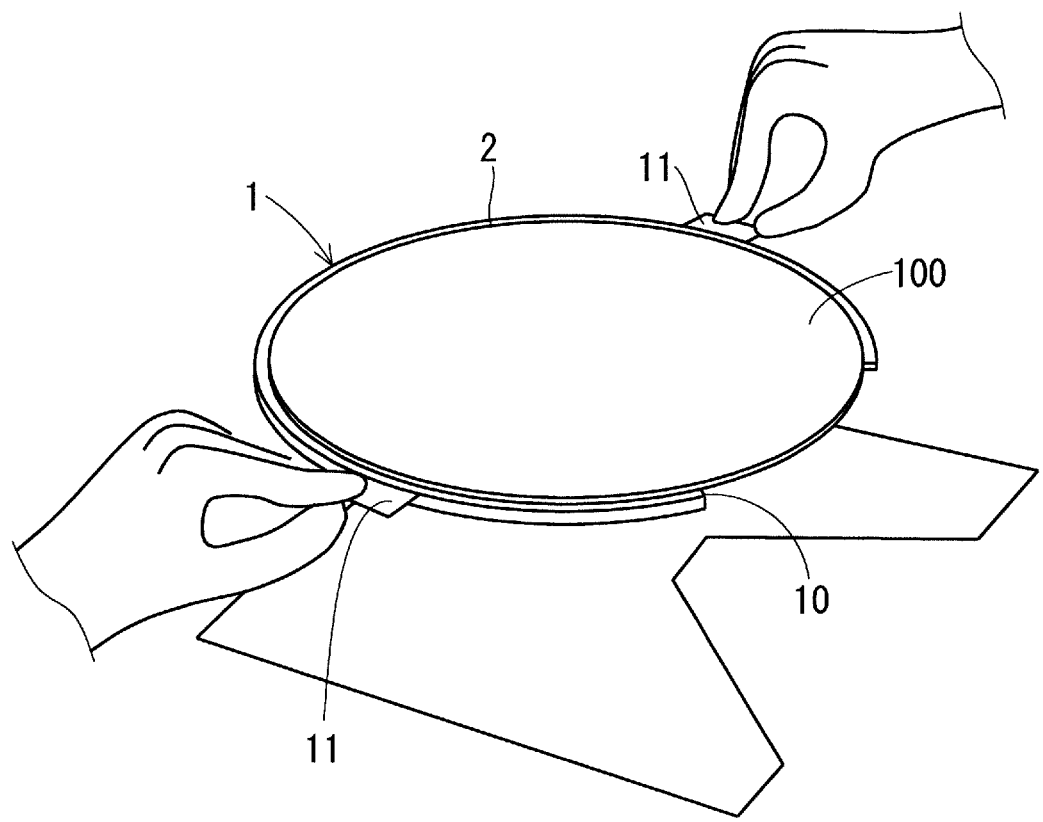
FIG. 8 is a diagram for explaining a step of taking out the semiconductor wafer stored on the carrier spacer.
Figure 9:
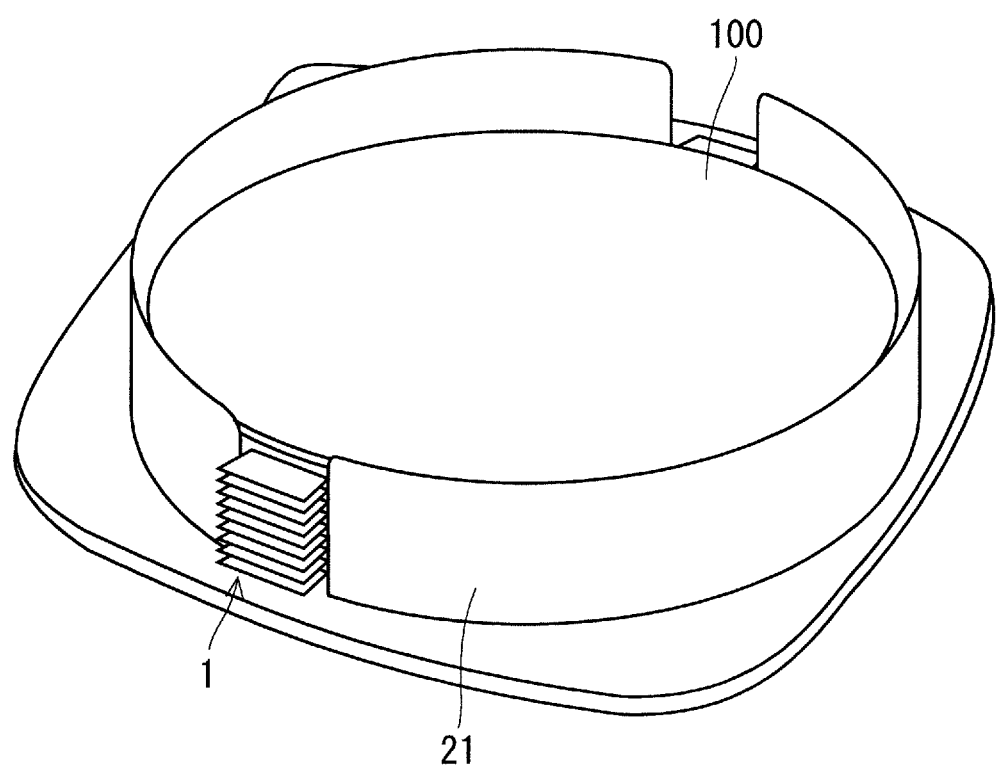
FIG. 9 is a perspective view showing a state in which the carrier spacers storing the semiconductor wafers are stacked and stored in a transferring case.

Next, a method of manufacturing a semiconductor device using the carrier spacer 1 will be described. FIG. 7 is a diagram for explaining a step of storing the semiconductor wafer 100 on the front surface side of the carrier spacer 1. FIG. 8 is a diagram for explaining a step of taking out the semiconductor wafer 100 stored on the carrier spacer 1. FIG. 9 is a perspective view showing a state in which the carrier spacers 1 storing the semiconductor wafers 100 are stacked and stored in the transferring case.

First, as shown in FIG. 7, the operator grips the outer peripheral part of the semiconductor wafer 100 using the wafer tweezers 20 and stores the semiconductor wafer 100 on the front surface side of the carrier spacer 1 from the cutout part 10 side.

Next, as shown in FIG. 8, the operator grips the pair of handles 11, takes out the carrier spacer 1, stores the carrier spacer 1 in the transferring case 21 with the semiconductor wafer 100 stored on the carrier spacer, and vertically stacks the plurality of carrier spacers 1 as shown in FIG. 9.

After the transferring case 21 is transferred to a periphery of a wafer processing apparatus (not shown), the operator grips the pair of handles 11 and takes out the carrier spacers 1 from the transferring case 21 one by one. Next, the operator uses the wafer tweezers 20 to grip the outer peripheral part of each semiconductor wafer 100 from the cutout part 10 side, takes out each semiconductor wafer 100 from the cutout part 10 side, and sets each semiconductor wafer 100 in the wafer processing apparatus.

In the wafer processing apparatus, the front surface of each semiconductor wafer 100 is plated or provided with an electrode. Alternatively, instead of these steps, the front surface of each semiconductor wafer 100 is irradiated with an electron beam or a particle beam.

As described above, the carrier spacer 1 according to the preferred embodiment includes an annular main body 2, a tapered part 3 formed on an inner peripheral part of a front surface of the main body 2 and inclined such that an inner peripheral side is located lower than an outer peripheral side, a tapered part 4 formed on the inner peripheral part of a reverse surface of the main body 2 and inclined such that the inner peripheral side is located above the outer peripheral side, a flat surface 5 formed on the outer peripheral side of the tapered part 3 on the front surface of the main body 2 and holding the reverse surface of the outer peripheral part of the semiconductor wafer 100, a peripheral edge part 7 formed on the outer peripheral side of the flat surface 5 of the main body 2 and provided with a step 7a having a height position higher than a height position of the flat surface 5, an arcuate cutout part 10 formed from the peripheral edge part 7 to the flat surface 5 of the main body 2, and a pair of handles 11 protruding from the peripheral edge part 7 toward the outer peripheral side.

The operator can therefore transfer the semiconductor wafers 100 individually together with the carrier spacers 1 using the pair of handles 11. This can reduce contact with the front surface of the semiconductor wafer 100 and thus prevent scratches on the semiconductor wafer 100 or adhesion of foreign matter to the semiconductor wafer 100.

As described above, the operator can transfer the carrier spacer 1 by gripping the pair of handles 11, and thus transfer the semiconductor wafer 1 easily. This can improve efficiency of a method of transferring. Further, scratches on or adhesion of foreign matter to the semiconductor wafer 100 can be prevented, and thus the yield of the semiconductor wafer 100 can be improved. Further, the carrier spacer 1 can be reused even after the semiconductor wafer 100 is taken out.

In addition, the carrier spacer 1 further includes the plurality of projections 8 projecting from the peripheral edge part 7 toward the inner peripheral side and holding the outer peripheral end of the semiconductor wafer 100. The plurality of projections 8 holds the outer peripheral end of the semiconductor wafer 100 in line contact, and thus the contact area with the outer peripheral end of the semiconductor wafer 100 can be reduced. This can prevent a case where the film deposited on the outer peripheral end of the semiconductor wafer 100 comes into contact with the carrier spacer 1 or the transferring case 21 during the transfer of the transferring case 21, and the film peels off from the semiconductor wafer 100 to generate dust.

The carrier spacer 1 further includes a groove 7b formed on the reverse surface of the peripheral edge part 7 such that the step 7a of the peripheral edge part 7 of the carrier spacer 1 adjacent downward can be fitted in the groove 7b. As a result, the vertically adjacent carrier spacers 1 can be stacked at a small interval, and thus a large number of semiconductor wafers 100 can be transferred in a smaller space.

Further, the carrier spacer 1 further includes the alignment protrusions 9 or the alignment recesses 19 formed on the front surface of the peripheral edge part 7. Thus, visually observing the two alignment protrusions 9 or the alignment recesses 19 by the operator can prevent mistakes in the vertical and horizontal directions when the carrier spacers 1 are vertically stacked, and allows the carrier spacers 1 to be stacked in a correct direction.

Further, damage to the semiconductor wafer 100 due to static electricity generated in the carrier spacer 1 can be suppressed because parts of the carrier spacer 1 include a conductive material.

Further, in the method of manufacturing a semiconductor device according to the preferred embodiment includes step (a) of storing the semiconductor wafer 100 on the front surface side of the carrier spacer 1, step (b) of storing the carrier spacer 1 in the transferring case 21 using the pair of handles 11, and step (c) of taking out the carrier spacer 1 from the transferring case 21 using the pair of handles 11, and then taking out the semiconductor wafer 100 from the cutout part 10 side of the carrier spacer 1 using wafer tweezers 20, and setting the semiconductor wafer 100 in the wafer processing apparatus.

It is therefore possible to handle the thin semiconductor wafer 100 for power modules, which is difficult to handle, without difficulty. This can prevent scratches on the semiconductor wafer 100 or adhesion of foreign matter to the semiconductor wafer 100.

Figure 10:
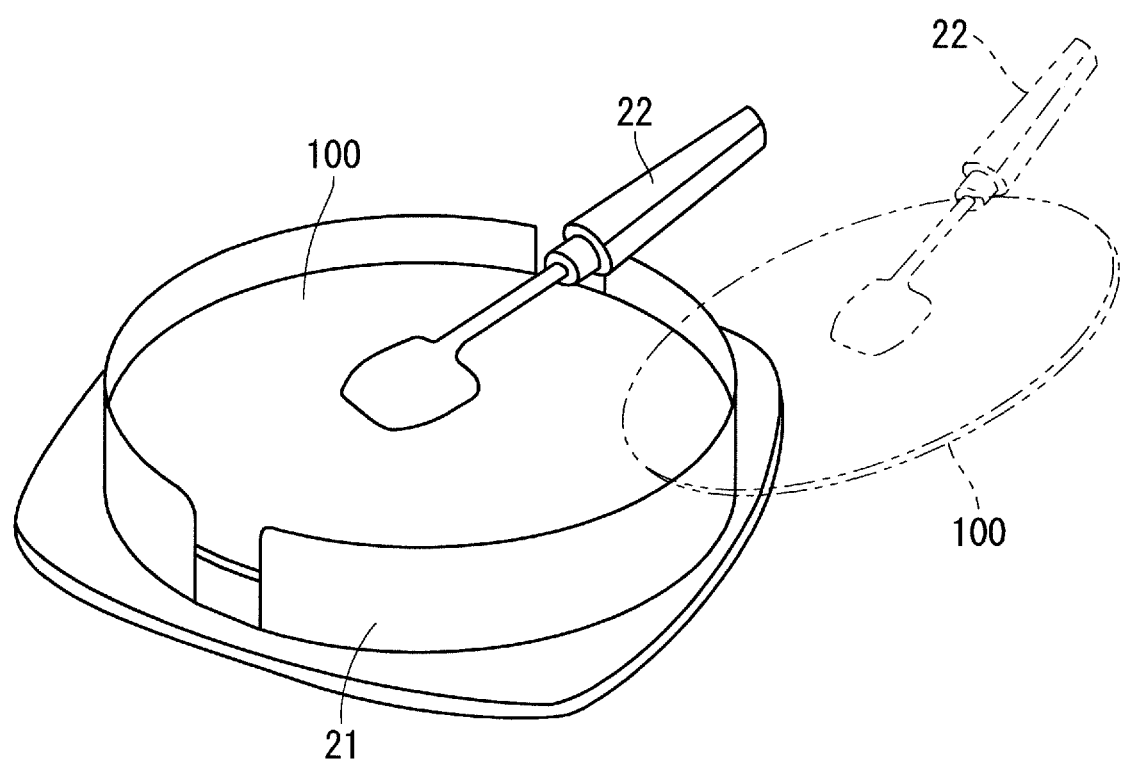
FIG. 10 is a diagram for explaining a step of taking out the semiconductor wafer from the transferring case in a related technique.

The wafer processing apparatus is an apparatus that forms plating or an electrode on the semiconductor wafer 100. In the related technique as shown in FIG. 10, in the wafer processing apparatus, it has been necessary to physically suck a thin region of a center of the semiconductor wafer 100 with the vacuum tweezers 22 or the like to handle the semiconductor wafer 100. There has been a quality problem such as a scratch or a wafer crack on the semiconductor wafer 100. FIG. 10 is a diagram for explaining a step of taking out the semiconductor wafer 100 from the transferring case 21 in the related technique. The two-dot chain line shows a state in which the semiconductor wafer 100 is sucked and handled with the vacuum tweezers 22.

On the other hand, in the method of manufacturing the semiconductor device according to the preferred embodiment, it is possible to handle the semiconductor wafer 100 by holding only the outer peripheral part which does not affect the quality of the semiconductor wafer 100. This suppresses occurrence of scratches and wafer cracks.

The wafer processing apparatus is an apparatus that irradiates the semiconductor wafer 100 with an electron beam or a particle beam. The carrier spacer 1 can be therefore handled and set in the wafer processing apparatus in a step of irradiating with an electron beam or a particle beam, and the irradiation can be performed without directly touching the semiconductor wafer 100.

Note that the preferred embodiment can be appropriately modified or omitted within the scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A carrier spacer for interposing between semiconductor wafers that are vertically adjacent when a plurality of the semiconductor wafers is vertically stacked, the carrier spacer comprising:
   a main body having an annular shape;
   a first tapered part formed on an inner peripheral part of a front surface of the main body and inclined such that an inner peripheral side is located below an outer peripheral side;
   a second tapered part formed on the inner peripheral part of a reverse surface of the main body and inclined such that the inner peripheral side is located above the outer peripheral side;
   a flat surface that is formed on the outer peripheral side of the first tapered part on the front surface of the main body and configured to hold a reverse surface of an outer peripheral part of one of the semiconductor wafers;
   a peripheral edge part formed on the outer peripheral side of the flat surface of the main body and provided with a step having a height position higher than a height position of the flat surface;
   a cutout part having an arc shape that is formed from the peripheral edge part of the main body to the flat surface; and
   a pair of handles protruding from the peripheral edge part toward the outer peripheral side.

2. The carrier spacer according to claim 1, further comprising a plurality of projections protruding from the peripheral edge part toward the inner peripheral side and configured to hold an outer peripheral end of one of the semiconductor wafers.

3. The carrier spacer according to claim 1, further comprising a groove formed on the reverse surface of the peripheral edge part such that the step of the peripheral edge part of the carrier spacer adjacent downward can be fitted in the groove.

4. The carrier spacer according to claim 1, further comprising an alignment protrusion or an alignment recess formed on a front surface of the peripheral edge part.

5. The carrier spacer according to claim 1, wherein parts of the carrier spacer include a conductive material.

6. A method of manufacturing a semiconductor device using the carrier spacer according to claim 1, the method comprising:
   (a) storing the semiconductor wafers on the front surface side of the carrier spacer;
   (b) storing the carrier spacer in a transferring case using the pair of handles; and
   (c) taking out the carrier spacer from the transferring case using the pair of handles, and then taking out the semiconductor wafers from the cutout part of the carrier spacer using wafer tweezers for further processing.

7. The method of manufacturing a semiconductor device according to claim 6, wherein the further processing forms plating or an electrode on the semiconductor wafers.

8. The method of manufacturing a semiconductor device according to claim 6, wherein the further processing irradiates the semiconductor wafers with an electron beam or a particle beam.

* * * * *